United States Patent [19]

Meusburger

[11] 4,168,538
[45] Sep. 18, 1979

[54] MONOLITHICALLY INTEGRATED SEMICONDUCTOR STORE

[75] Inventor: Günther Meusburger, Munich, Fed. Rep. of Germany

[73] Assignee: Siemens Aktiengesellschaft, Berlin & Munich, Fed. Rep. of Germany

[21] Appl. No.: 932,499

[22] Filed: Aug. 10, 1978

[30] Foreign Application Priority Data

Sep. 6, 1977 [DE] Fed. Rep. of Germany ....... 2740113

[51] Int. Cl.$^2$ ............................................. G11C 11/40
[52] U.S. Cl. .................................. 365/182; 307/238; 365/51
[58] Field of Search ......................... 365/181, 182, 51; 307/238, 279

[56] References Cited

U.S. PATENT DOCUMENTS 4,125,854  11/1978  McKenny et al. .................... 365/182

OTHER PUBLICATIONS

"Abstracts of the Second European Solid-State Circuits Conference," 21 through 24, Sep. 1976, Toulouse, Section 4.4, pp. 40–41.

Primary Examiner—Terrell W. Fears
Attorney, Agent, or Firm—Hill, Van Santen, Steadman, Chiara & Simpson

[57] ABSTRACT

A monolithically integrated semiconductor store is disclosed having a plurality of storage elements on a semiconductor layer with each storage element having a storage capacitor and a selector element. The selector element includes first and second transfer gates. The first transfer gate connects to a word decoder and the second transfer gate similarly connects to a word decoder at a different input. The source-drain path of the first transfer gate connects to the storage capacitor and the source-drain path of the second transfer gate connects to an evaluator and regenerator circuit via a bit line. With the integrated store disclosed, for a given number of storage elements, the bit lines are reduced to approximately half their length and the number of requisite word lines is reduced by half as compared to previous integrated stores.

10 Claims, 3 Drawing Figures

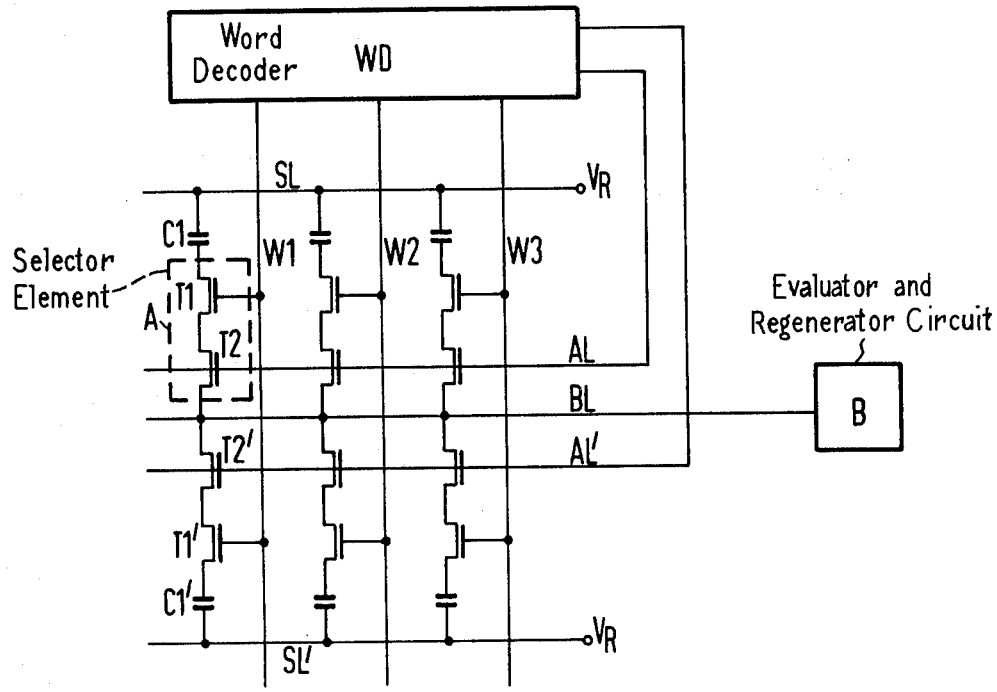

MONOLITHICALLY INTEGRATED SEMICONDUCTOR STORE

BACKGROUND OF THE INVENTION

The invention relates to a monolithically integrated semiconductor store having a word decoder connecting by word lines to a plurality of storage elements and wherein an evaluator circuit connects via bit lines to the storage elements.

A further conductor store of this type is known for example from the "Abstracts of the Second European Solid-State Circuits Conf., (ESSCIRC) 21st to 24th Sept. 1976, Toulouse, Section 4.4, pages 40 and 41".

SUMMARY OF THE INVENTION

An object of the invention is to further reduce the storage space required for a semiconductor store of the noted type. This is achieved in accordance with the invention by providing each storage element with a storage capacitor connected in series with first and second transfer gates. The first transfer gate has its gate connected to a word line and the second transfer gate has its gate connected to another line connecting with the word decoder. The source-drain paths of the first and second transfer gates are connected in series to a bit line. The bit lines are provided as doped zones of opposite conductivity type which are provided at a surface of a semiconductor layer. First and second strips of a first conductive coating are applied on an insulating layer over the semiconductor layer on each side of the bit lines. A further insulating layer is provided over the first and second strips. A second conductive coating is applied over the second insulating layer such that it lies over the first and second strips and also extends between a gap between the first and second strips. The word line connects with the second conductive coating.

The advantage which can be attained by the invention is that in a storage field comprising a given number of storage elements, in comparison to conventional forms of storage the number of requisite word lines is reduced by half, and the bit lines are reduced to approximately half their length. This provides the possibility of substantially reducing the capacitance of the storage capacitors while maintaining the reliability of analysis of the stored information, which leads to a significant reduction in the semiconductor area required for the individual storage element and thus for the entire store.

DESCRIPTION OF THE PREFERRED EMBODIMENTS

Figure 1:
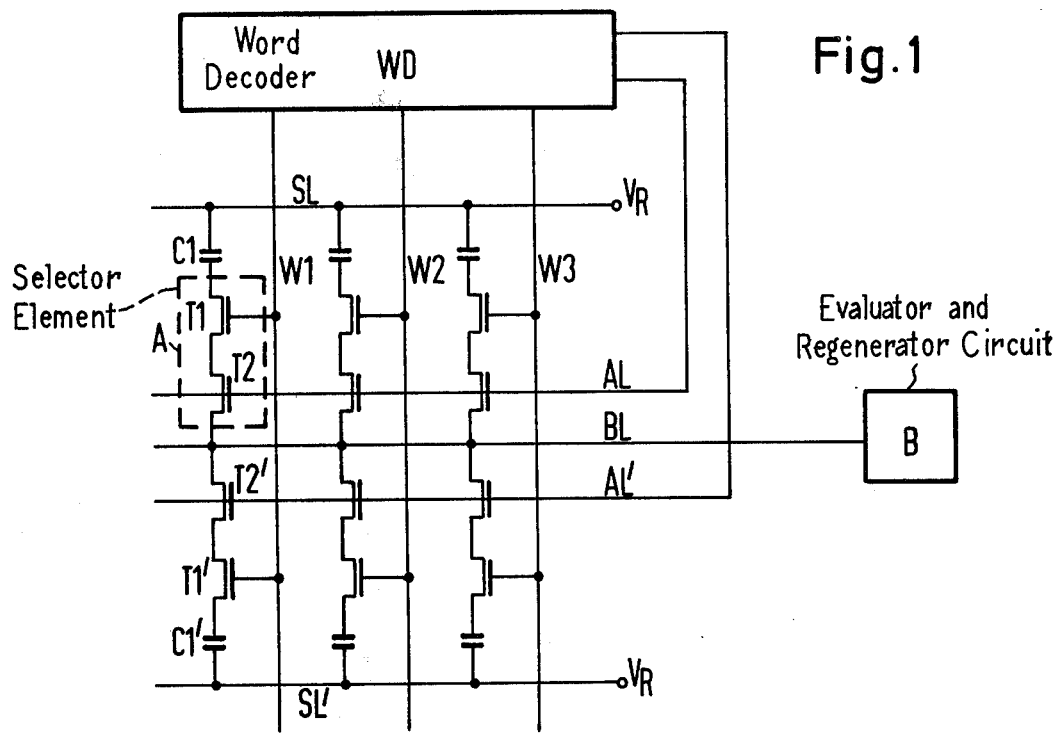
FIG. 1 is the fundamental circuit diagram of a store designed in accordance with the invention.

FIG. 1 illustrates a storage field of a semiconductor store designed in accordance with the invention, which comprises six storage elements. These are arranged in two rows and three columns, the two rows enclosing a bit line BL between them. The storage element arranged at the left-hand end of the upper row has a storage capacitor C1 whose storage electrode is connected to a storage line SL connected to the voltage $V_R$, and whose counter electrode, which lies within a storage zone on the surface side of a doped semiconductor layer, is connected via a selector element A (bordered with broken lines) to the bit line BL. The selector element A contains a first transfer gate T1 which is connected to a word line W1, and contains a second transfer gate T2 which is connected to a first selector line AL. The lines W1 and AL lead to the outputs of a word decoder WD. An evaluator and regenerator circuit B is connected at the end of the bit line BL.

The storage element arranged at the left-hand end of the lower row with the storage capacitor C1' is likewise connected to the word line W1 via the first transfer gate T1' of its selector element, whereas it is connected via the second transfer gate T2' to a second selector line AL' which leads to a further output of the word decoder WD. The other storage elements are connected in a similar manner to their assigned drive lines, the storage elements arranged in a column each being connected via their selector elements to one and the same word line W2, W3 but to different selector lines AL and AL'. All the illustrated storage elements can be connected via their selector elements to the illustrated bit line BL.

The function of a selector element, e.g. A, will be explained in detail in the following: initially it will be assumed that the first transfer gate T1 forms either the gate of a field effect transistor or the gate of a charge shift element (CCD). In each case, on the occurrence of a drive signal on the word line W1, in a doped semiconductor layer which is arranged beneath the transfer gate T1 and separated from the latter by a thin insulating layer there forms a space charge zone which has a surface potential which is such that shifts of charge can occur between the storage capacitor C1 and the bit line BL. Here it has been assumed that a further drive signal which is supplied via the selector line AL creates a further space charge zone beneath the second transfer gate T2 in a similar manner. Then a source zone which establishes the connection to the bit line BL is arranged on the surface side of the semiconductor layer, and is oppositely doped to said semiconductor layer. The bit line BL is connected by the two space charge zones to the storage zone of the storage capacitor, which zone is provided in the semiconductor layer and either exhibits an electrical charge or does not in dependence upon a stored binary signal.

In accordance with the transistor symbols used in FIG. 1, it is conceivable to design the selector element A not only with the source zone connected to the bit line BL, but also with two drain zones which are oppositely doped to the semiconductor layer. The drain zone which belongs to T2 lies between the two space charge zones and simultaneously represents a source zone belonging to T1, whereas the other drain zone lies between the space charge zone constructed beneath T1 and the storage zone of C1. On the other hand, space can be gained by omitting these drain zones and allowing the storage zone to approach the source zone to such an extent that these are directly connected to one another by means of the space charge zones forming beneath T1 and T2.

During operation, in the case of a p-doped semiconductor layer composed for example of silicon which accommodates the storage circuit illustrated in FIG. 1, the storage element with the storage capacitor C1 is selected in that via the outputs of the word decoder WD a drive signal of e.g. +5 V is connected both to the word line W1 and to the first selector line AL. If, apart from the word line W1, not the line AL but the line AL' is fed with a drive signal, this leads to the selection of the storage element with the storage capacitor C1'. The selector storage capacitor is connected to the bit line BL and according to its state of charge which is dependent upon the stored item of binary information, recharging occurs between said capacitor and the line capacitance of the bit line BL previously brought to a reference potential in the one or the other direction. This leads to a shift of potential on the bit line BL in the direction of more positive or more negative values which is separately analyzed by means of the evaluator and regenerator circuit B with respect to the direction of shift. On the other hand, at the terminal of B connected to the bit line BL there is formed a regenerated, binary signal which correponds to the read-out information and which is re-entered into the selected storage capacitor which at this point of time is still connected to the bit line.

The storage field illustrated in FIG. 1 can be arbitrarily extended by the addition of further storage elements which are assigned further bit lines and words lines in the described manner.

A fundamental feature consists in that due to the simultaneous operation via in each case one of the word lines and one of two selector lines AL and AL', one single storage cell is selectively connected to its assigned bit line although there are only half as many word lines as connectable storage cells. Consequently the bit line BL is shortened to approximately half the length required in conventional semiconductor stores of this type.

Figure 2:
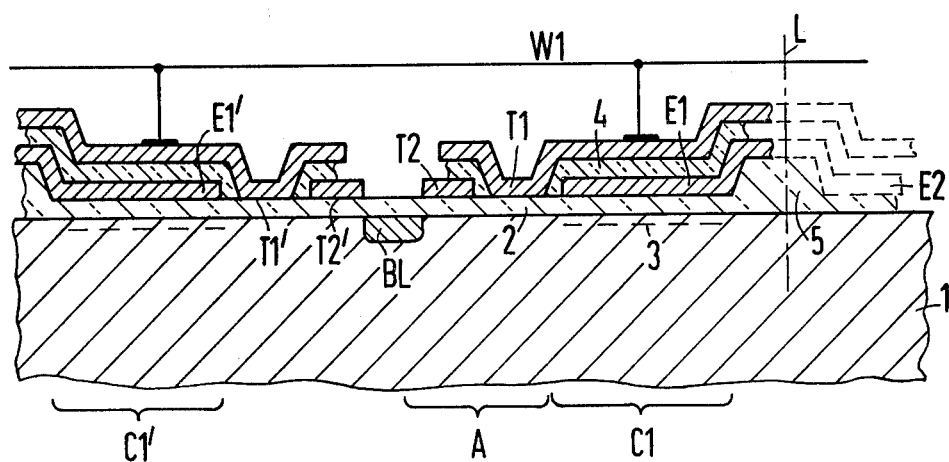
FIG. 2 is a cross-section through two storage elements designed in accordance with the invention.

FIG. 2 is a cross-section through a preferred embodiment of two storage elements corresponding to FIG. 1 which are arranged on opposite sides of the bit line BL and can be driven by one and the same word line W1. Here the bit line BL is arranged is a p-doped semiconductor layer at a surface side and consists, for example, of a silicon $n^+$-doped, strip-like zone, one portion of which forms the source zones of the two illustrated storage elements. The transfer gate electrodes T2 and T1 are arranged next to one another above the semiconductor layer 1 separated from the latter by a thin insulating layer consisting for example of $SiO_2$, and a storage electrode E1 having the storage capacitance C1 is arranged on the right-hand side of T1 and above the insulating layer 2.

In FIG. 2 the bit line BL runs at right angles to the image plane. The transfer gate electrode T2 and the storage electrode E1 represent portions of a first and second strip respectively of a first electrically conductive coating which run in the same direction. The electrodes, corresponding to one another, of the storage elements arranged in the same row each consist of further portions of these strips which thus form the first selector line AL and the storage line SL in the region of the storage field. Terminals provided at the end of these strips are then connected to a voltage source which supplies the reference voltage $V_R$ and to an output of the word decoder WD. The first transfer gate electrode T1 consists of a part of a second electrically conductive coating which is separated from the first by an insulating layer 4. T1 runs in the region of the gap between T2 and E1 in the plane of the first conductive coating so that in this region it is only separated from the semiconductor layer 1 by the insulating layer 2. T1 is connected by a contact hole provided in an insulating layer which covers the second conductive coating to the word line W1 which takes the form of a conductor path and runs above the insulating layer. Under the influence of the positive voltage $V_R$ connected to E1, an inversion layer 3 is formed in that region of the semiconductor layer 1 which lies beneath E1 and is referred to as a storage zone. If the storage element is now operated via T1 and T2 with e.g. +5 V, the common space charge zone which is formed beneath these electrodes allows a charge shift to occur between the inversion layer 3 and the source zone and bit line BL which is equivalent to a conductive connection between these components.

On the left-hand side of the bit line BL, FIG. 2 shows an analogous structure of the storage element which contains the storage capacitor C1', where the second transfer gate electrode T2' and the storage electrode E1' again form portions of strips of the first electrically conductive coating which are connected via end-side terminals to the voltage source which supplies the reference voltage $V_R$ and to a further output of the word decoder WD.

The storage elements arranged between two adjacent bit lines can be constructed to be symmetrical to a plane which is referenced L in FIG. 2 and runs at right angles to the image plane, as indicated in broken lines. Here the storage electrodes E1, E2 of adjacent storage elements and the corresponding electrodes of the further storage elements which are arranged in the same rows consist of sub-zones of a strip of the first conductive coating. The individual storage capacitors are separated from one another by zones 5 of the insulating layer 2 which have a greater thickness. In an embodiment of this type the first transfer gate electrodes T1 of two adjacent storage elements which are located between two bit lines and can be operated via the same word line then also consist of a cohesive part of the second, electrically conductive coating.

As a modification of the previously described embodiment in FIG. 2, the transfer gate electrodes T1 and T2 can also be interchanged. In that case the electrode reference T2 in FIG. 2 is connected to the word line W1, whereas the electrode referenced T1 represents a portion of a strip of the second, electrically conductive coating, which strip is common to all the storage elements of a row and forms the first selector line AL. Furthermore, the inversion layer 3 within the storage zone of the individual storage capacitors can also be replaced by a semiconductor zone doped oppositely to the semiconductor layer. In this case the storage line SL and SL' are connected to ground potential.

Advantageously the first and/or second electrically conductive coating consists of a highly doped semiconductor material, for example polycrystalline silicon. However they can also be designed as metallic coatings, composed for example of aluminum.

The aforementioned semiconductor dopings can be replaced by the opposite dopings if the supplied voltages are replaced by voltages of the opposite polarity.

Figure 3:
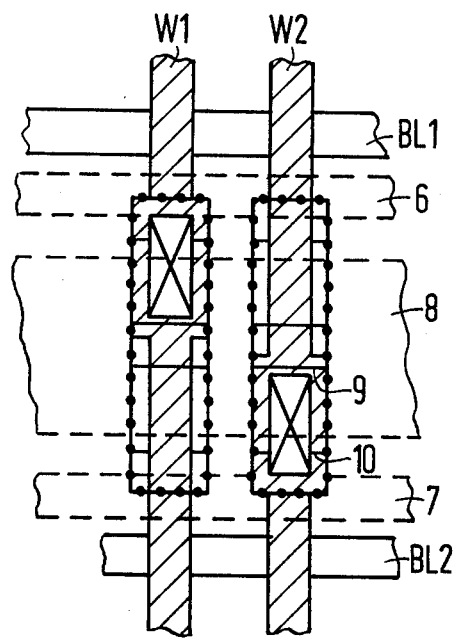
FIG. 3 illustrates the layout of a store of this invention having a storage field consisting of four storage elements.

FIG. 3 illustrates the layout of a storage field which consists of four storage cells of the described type and is arranged between two adjacent bit lines. The bit lines referenced BL1 and BL2 here run horizontally, in the same way as the adjacent strips 6, 7 of the first conductive coating which are referenced T2 and T2' in the case of the storage elements illustrated in FIG. 2. The storage electrodes of all the storage elements illustrated in FIG. 3 consist of sub-zones of a strip 8 of the first conductive coating. The cohesive components of the second, electrically conductive coating which represent the transfer gate electrodes T1 corresponding to FIG. 2 are provided with equidistant points at their borders, whereas the rectangular contact holes by which they are connected to the shaded word lines W1 and W2 designed as aluminum conductor paths, are each characterized by the diagonals. The solid lines referenced 9 and 10 define the part of the thin insulating layer 2 for the storage capacitor of the right-hand, lower storage element. In an experimental construction of a storage element corresponding to FIG. 3, a storage area of only 175 $\mu m^2$ was achieved using 3.5 $\mu m$-wide word, bit and storage lines.

Although various minor modifications may be suggested by those versed in the art, it should be understood that I wish to embody within the scope of the patent warranted hereon, all such embodiments as reasonably and properly come within the scope of my contribution of the art.

I claim as my invention:

1. A monolithically integrated semiconductor store, comprising:
    (a) storage elements on a semiconductor layer and each storage element having a storage capacitor and a selector element;
    (b) the storage capacitor having a storage electrode which is arranged above the doped semiconductor layer and is separated from the layer by a thin insulating layer, a storage zone being arranged on a surface side of the semiconductor layer;
    (c) the selector element having a source zone doped oppositely to the semiconductor layer and which is connected to a bit line and is arranged on the surface side of the semiconductor layer, a first transfer gate having a gate electrode which is connected to a word line and which is arranged above a portion of the semiconductor layer lying between the source zone and the storage zone and is separated from the semiconductor layer by a thin insulating layer;
    (d) one of the first transfer gates being arranged on opposite sides of the bit line and having their gate electrodes connected to the same word line;
    (e) each storage element being provided with a second transfer gate having a gate electrode which is arranged beside the first transfer gate; and
    (f) the second transfer gate electrodes of the storage elements located on one side of the bit line being connected by a first selector line to a word decoder, and the second transfer gate electrode of the storage elements located on the other side of the bit line being connected by a second selector line to the word decoder.

2. A semiconductor storage as claimed in claim 1 in which the second transfer gate electrode of the storage elements arranged on one side of the bit line comprise individual portions of a first strip of a first electrically conductive coating.

3. A semiconductor store as claimed in claim 2 in which the capacitor storage electrodes of the storage elements arranged on one side of the bit line comprise individual portions of a second strip of the first electrically conductive coating.

4. A semiconductor store as claimed in claim 3 in which the first transfer gate electrode of each storage element comprises a portion of a second electrically conductive coating which substantially fills a gap between the two strips of the first conductive coating, said second electrically conductive coating being applied above the first and is separated from the latter by an insulating layer.

5. A semiconductor store as claimed in claim 4 in which portions of the second electrically conductive coating which correspond to the storage elements located on one side of the bit line and form the first transfer gate electrodes comprise portions of a strip of the second electrically conductive coating which is common to the storage elements located on one side of the bit line.

6. A semiconductor store as claimed in claim 1 in which the capacitor storage electrodes of storage elements arranged between two adjacent bit lines comprise sub-zones of a strip of a first conductive coating, the individual capacitor storage electrodes being separated from one another by thicker zones of insulating layer arranged beneath the strip of the first conductive coating.

7. A semiconductor store as claimed in claim 1 in which the bit lines comprise strip-like oppositely doped zones arranged on the surface side of the semiconductor layer, the first transfer gate electrodes between two adjacent bit lines being formed of a common second electrically conductive coating which also connects to the word line, said second electrically conductive coating being positioned above an insulating layer covering a first conductive coating forming the capacitor storage electrodes.

8. A semiconductor store as claimed in claim 7 in which the first and second electrically conductive coatings comprise a highly doped polycrystalline silicon.

9. A semiconductor store comprising:
    (a) a semiconductor layer of first conductivity type;
    (b) a plurality of strip zones of second conductivity type being provided at a surface of the semiconductor layer and forming bit lines;
    (c) a first insulating layer on the surface of the semiconductor layer;
    (d) a first strip of a first conductive coating on the first insulating layer on each side of the bit lines;
    (e) a second strip of the first conductive coating alongside the first strips and forming a gap between the first and second strips;
    (f) a second insulating layer over the first and second strips of the first conductive coating;
    (g) a second conductive coating on the second insulating layer and overlying the first and second strips and also extending into the gap between the first and second strips; and
    (h) a word line connecting to the second conductive coatings.

10. The store of claim 9 in which a storage element is formed having a capacitor with an electrode formed by portions of the second strip of first conductive coating, a first gate having a gate electrode formed of a portion of the second conductive coating, and a second transfer gate having a gate electrode formed of a portion of the first strip of first conductive coating.

* * * * *